US012765216B2

(12) United States Patent
Sun et al.

(10) Patent No.: US 12,765,216 B2
(45) Date of Patent: Oct. 13, 2026

(54) DISPLAY PANEL AND DISPLAY APPARATUS

(71) Applicant: BOE TECHNOLOGY GROUP CO., LTD., Beijing (CN)

(72) Inventors: Xuefei Sun, Beijing (CN); Jaegeon You, Beijing (CN); Liyan Liu, Beijing (CN); Yingtao Wang, Beijing (CN); Qian Jia, Beijing (CN)

(73) Assignee: BOE Technology Group Co., Ltd., Chaoyang District (CN)

( * ) Notice: Subject to any disclaimer, the term of this patent is extended or adjusted under 35 U.S.C. 154(b) by 436 days.

(21) Appl. No.: 18/578,183

(22) PCT Filed: Aug. 2, 2022

(86) PCT No.: PCT/CN2022/109687
§ 371 (c)(1),
(2) Date: Jan. 10, 2024

(87) PCT Pub. No.: WO2024/026671
PCT Pub. Date: Feb. 8, 2024

(65) Prior Publication Data
US 2025/0107388 A1 Mar. 27, 2025

(51) Int. Cl.
*H10K 59/40* (2023.01)
*G06F 3/041* (2006.01)
(Continued)

(52) U.S. Cl.
CPC ........... *H10K 59/40* (2023.02); *G06F 3/0412* (2013.01); *G06F 3/0443* (2019.05);
(Continued)

(58) Field of Classification Search
None
See application file for complete search history.

(56) References Cited

U.S. PATENT DOCUMENTS

2015/0362638 A1 12/2015 Wang
2021/0020701 A1 1/2021 Zheng
(Continued)

FOREIGN PATENT DOCUMENTS

CN 104062795 A 9/2014
CN 111668286 A 9/2020
(Continued)

*Primary Examiner* — Jack S Chen
(74) *Attorney, Agent, or Firm* — The Webb Law Firm

(57) ABSTRACT

A display panel includes a display substrate and a touch layer. The display substrate includes a substrate and an anode layer. The anode layer includes a plurality of anodes, and at least one edge of at least one anode is provided with at least one groove therein. The touch layer is located on a light exit side of the display substrate. The touch layer includes a metal mesh structure, the metal mesh structure includes a plurality of first metal lines, and each first metal line includes an opening. An orthographic projection of each of the plurality of first metal lines on the substrate is located between orthographic projections of the plurality of anodes on the substrate. An orthogonal projection of each groove of the at least one anode on the substrate is disposed opposite to an orthogonal projection of an opening of a first metal line on the substrate.

20 Claims, 7 Drawing Sheets

(51) Int. Cl.
*G06F 3/044* (2006.01)
*H10K 59/80* (2023.01)

(52) U.S. Cl.
CPC ..... *H10K 59/80515* (2023.02); *G06F 3/0446* (2019.05); *G06F 2203/04111* (2013.01); *G06F 2203/04112* (2013.01)

(56) References Cited

U.S. PATENT DOCUMENTS

| | | | | |
|---|---|---|---|---|
| 2021/0405803 | A1 | 12/2021 | Ye | |
| 2022/0069027 | A1 | 3/2022 | Wang et al. | |
| 2022/0255037 | A1 | 8/2022 | Xin et al. | |
| 2022/0308694 | A1 | 9/2022 | Tong et al. | |
| 2022/0317807 | A1 | 10/2022 | Tong et al. | |
| 2022/0359625 | A1 | 11/2022 | Yang et al. | |
| 2025/0107388 | A1* | 3/2025 | Sun | G06F 3/0443 |

FOREIGN PATENT DOCUMENTS

| | | | |
|---|---|---|---|
| CN | 111694466 | A | 9/2020 |
| CN | 111752417 | A | 10/2020 |
| CN | 111799320 | A | 10/2020 |
| CN | 112968138 | A | 6/2021 |
| CN | 113113550 | A | 7/2021 |
| CN | 114023791 | A | 2/2022 |
| CN | 216145641 | U | 3/2022 |
| WO | 2021147175 | A1 | 7/2021 |
| WO | 2021196082 | A1 | 10/2021 |

* cited by examiner

DISPLAY PANEL AND DISPLAY APPARATUS

CROSS-REFERENCE TO RELATED APPLICATION

This application is the United States national phase of International Patent Application No. PCT/CN2022/109687, filed Aug. 2, 2022, the disclosure of which is hereby incorporated by reference in its entirety.

BACKGROUND OF THE INVENTION

Field of the Invention

The present disclosure relates to the field of display technologies, and in particular, to a display panel and a display apparatus.

Description of Related Art

Organic light-emitting diode (OLED) display panels have attracted widespread attention due to their advantages of active luminescence, wide viewing angle, high contrast, fast response speed, and low power consumption. The flexible multi-layer on cell (FMLOC) structure integrates a touch layer on the display panel, and may further reduce the thickness of the display apparatus, which is conducive to lightness and thinness of the display apparatus.

SUMMARY OF THE INVENTION

In an aspect, a display panel is provided. The display panel includes a display substrate and a touch layer. The display substrate includes a substrate and an anode layer disposed on a side of the substrate. The anode layer includes a plurality of anodes, and at least one edge of at least one anode is provided with at least one groove therein. The touch layer is located on a light exit side of the display substrate. The touch layer includes a metal mesh structure, the metal mesh structure includes a plurality of first metal lines, and each first metal line includes an opening. An orthographic projection of each of the plurality of first metal lines on the substrate is located between orthographic projections of the plurality of anodes on the substrate. An orthogonal projection of each groove of the at least one anode on the substrate is disposed opposite to an orthogonal projection of an opening of a first metal line on the substrate.

In some embodiments, a length of each groove in a first direction is greater than or equal to a length of an opening opposite to the groove in the first direction. The first direction is substantially parallel to an extending direction of a first metal line where the opening is located.

In some embodiments, in the first direction, the length of the groove is D1, the length of the opening opposite to the groove is D2, and D1 is equal to a sum of D2 and a value ranging from 0.1 μm to 1 μm, inclusive (D1=D2+(0.1 μm to 1 μm)).

In some embodiments, the groove is arranged symmetrically about a reference plane. The reference plane is perpendicular to the substrate and passes through a center line of the opening extending in a second direction, and the second direction is parallel to the substrate and perpendicular to the first direction.

In some embodiments, in the first direction, a difference between the length of the groove and the length of the opening opposite to the groove is D3; and in a second direction, a depth of the groove is D4. D4 is equal to a value ranging from 0.3 times D3 to 0.7 times D3 (D4=(0.3 to 0.7)×D3). The second direction is parallel to the substrate and perpendicular to the first direction.

In some embodiments, a side edge of each groove opposite to the first metal line is in a zigzag shape.

In some embodiments, at least part of side edges of the anode adjacent to the groove are in zigzag shapes.

In some embodiments, the display panel has a first display region and a second display region, and light transmittance of the first display region is greater than light transmittance of the second display region. The plurality of anodes include a plurality of first anodes, the plurality of first anodes are located in the first display region, and at least one edge of each first anode includes at least one groove. The metal mesh structure includes a plurality of first grids, each first grid includes at least two first metal lines, and an orthogonal projection of the first grid on the substrate surrounds an orthographic projection of at least one first anode on the substrate.

In some embodiments, the orthogonal projection of the first grid on the substrate surrounds an orthographic projection of a single first anode on the substrate, and edges of the single first anode are provided with two grooves therein.

In some embodiments, the metal mesh structure further includes a plurality of second metal lines, the plurality of second metal lines are located in the first display region, and the plurality of second metal lines are continuous line segments. The first grid further includes at least one second metal line. A line width of the first metal line is smaller than a line width of the second metal line.

In some embodiments, the metal mesh structure further includes a plurality of third metal lines, the plurality of third metal lines are located in the second display region, and the plurality of third metal lines are continuous line segments. The line width of the first metal line is substantially equal to a line width of a third metal line.

In some embodiments, the plurality of anodes further includes a plurality of second anodes, the plurality of second anodes are located in the second display region, and at least one edge of each second anode includes at least one groove. The metal mesh structure further includes a plurality of second grids, each second grid includes at least two first metal lines, and an orthogonal projection of the second grid on the substrate surrounds an orthographic projection of at least one second anode on the substrate.

In some embodiments, the orthogonal projection of the second grid on the substrate surrounds an orthographic projection of a single second anode on the substrate, and edges of the single second anode are provided with two grooves therein. In some embodiments, the metal mesh structure further includes a plurality of third metal lines located in the second display region, and the second grid further includes at least one third metal line.

In some embodiments, the plurality of anodes further includes a plurality of third anodes and a plurality of fourth anodes, the plurality of third anodes are located in the first display region, and the plurality of fourth anodes are located in the second display region. The metal mesh structure further includes a plurality of third grids and a plurality of fourth grids, and orthogonal projections of the plurality of third grids and the plurality of fourth grids on the substrate are continuous closed patterns. An orthogonal projection of each third grid on the substrate surrounds an orthographic projection of a third anode on the substrate, and an orthogonal projection of each fourth grid on the substrate surrounds an orthographic projection of a fourth anode on the substrate. The metal mesh structure further includes a plurality of second metal lines located in the first display region and a plurality of third metal lines located in the second display region, the third grid includes multiple second metal lines connected end to end, and the fourth grid includes multiple third metal lines connected end to end.

In some embodiments, at least part of edges of the third anode are in zigzag shapes, and/or at least part of edges of the fourth anode are in zigzag shapes.

In some embodiments, the display panel includes a plurality of sub-pixels, each sub-pixel includes an anode in the plurality of anodes, and the plurality of sub-pixels includes a plurality of first color sub-pixels, a plurality of second color sub-pixels and a plurality of third color sub-pixels. The display panel has a first display region and a second display region. The plurality of anodes include a plurality of first anodes with at least one groove and located in the first display region, a plurality of second anodes with at least one groove and located in the second display region, a plurality of third anodes located in the first display region and a plurality of fourth anodes located in the second display region. Areas of a first anode, a second anode, a third anode and a fourth anode included in the plurality of first color sub-pixels are substantially equal. Areas of a first anode, a second anode, a third anode and a fourth anode included in the plurality of second color sub-pixels are substantially equal. Areas of a first anode, a second anode, a third anode and a fourth anode included in the plurality of third color sub-pixels are substantially equal.

In some embodiments, the touch layer includes a first metal layer, a second metal layer, and an insulating layer located between the first metal layer and the second metal layer. The insulating layer is provided with a plurality of via holes therein. One of the first metal layer and the second metal layer includes a plurality of first touch electrodes, a plurality of second touch electrodes and a plurality of connection portions, and another of the first metal layer and the second metal layer includes a plurality of bridge portions. Each connection portion connects two adjacent first touch electrodes, and each bridge portion connects two adjacent second touch electrodes through via holes. Alternatively, each connection portion connects two adjacent second touch electrodes, and each bridge portion connects two adjacent first touch electrodes through via holes. At least one of the first touch electrodes, the second touch electrodes, the connection portions and the bridge portions includes the metal mesh structure.

In some embodiments, the display substrate further includes an encapsulation layer. The encapsulation layer is disposed on a side of the anode layer away from the substrate and includes a first inorganic material layer, an organic material layer and a second inorganic material layer that are stacked in sequence in a direction perpendicular to the substrate and away from the substrate. The touch layer is disposed on the second inorganic material layer of the encapsulation layer.

In another aspect, a display apparatus is provided. The display apparatus includes the display panel as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product to which the embodiments of the present disclosure relate.

DESCRIPTION OF THE INVENTION

Figure 1:
FIG. 1 is a plan view showing a structure of a display apparatus, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "connection" and "connected" and derivatives thereof may be used. For example, the term "connected" may be used in the description of some embodiments to indicate that two or more components are in direct physical or electrical contact with each other. For another example, the term "connection" may be used in the description of some embodiments to indicate that two or more components are in direct physical contact.

The phrase "A and/or B" includes the following three combinations: only A, only B, and a combination of A and B.

The phrase "applicable to" or "configured to" as used herein indicates an open and inclusive expression, which does not exclude apparatuses that are applicable to or configured to perform additional tasks or steps.

The term "about", "substantially" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

Some embodiments of the present disclosure provide a display apparatus 1000. Referring to FIG. 1, the display apparatus 1000 may be any apparatus that displays images whether in motion (such as a video) or fixed (such as a still image), and regardless of text or image. For example, the display apparatus 1000 may be any product or component having a display function, such as a television, a notebook computer, a tablet computer, a mobile phone, an electronic photo, an electronic billboard or sign, a personal digital assistant (PDA), a navigator, a wearable device, an augmented reality (AR) device, or a virtual reality (VR) device.

In some embodiments, the display apparatus 1000 may be a liquid crystal display (LCD) apparatus, an electroluminescent display apparatus or a photoluminescent display apparatus. In a case where the display apparatus 1000 is the electroluminescent display apparatus, the electroluminescent display apparatus may be an organic light-emitting diode (OLED) display apparatus or a quantum dot light-emitting diode (QLED) display apparatus. In a case where the display apparatus 1000 is the photoluminescent display apparatus, the photoluminescent display apparatus may be a quantum dot photoluminescent display apparatus. Embodiments of the present disclosure do not limit a specific type of the display apparatus 1000. For example, the embodiments of the present disclosure are described by taking an example where the display apparatus 1000 is the OLED display apparatus.

Figure 2:
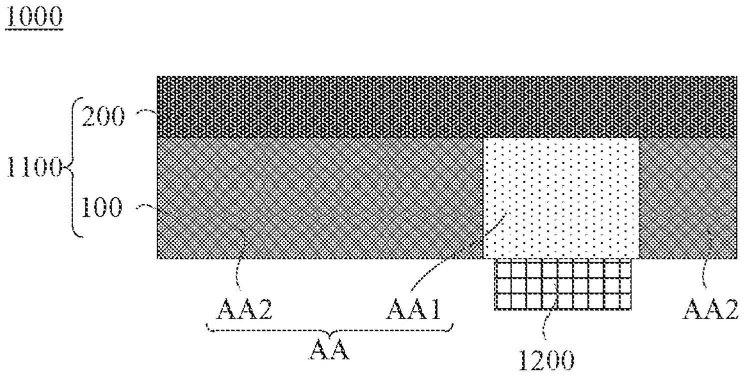
FIG. 2 is a sectional view showing a structure of a display apparatus, in accordance with some embodiments.

In some embodiments, referring to FIG. 2, the display apparatus 1000 includes a display panel 1100 and a functional device 1200. The display panel 1100 may include a display substrate 100 and a touch layer 200 that are stacked, and the touch layer 200 is located on a light exit side of the display substrate 100. The functional device 1200 may be a device that needs to collect light from the light exit side (an upper side in FIG. 2) of the display panel 1100. For example, the functional device 1200 may be at least one of a distance sensor, a fingerprint recognition module and a front-facing camera.

The display substrate 100 has a light exit surface (e.g., an upper surface of the display substrate 100 in FIG. 2), and the light exit surface refers to a surface of the display substrate 100 used for displaying image information. The light exit side of the display substrate 100 refers to a side proximate to the light exit surface of the display substrate 100. That is, the touch layer 200 is disposed on a side of the display substrate 100 proximate to the light exit surface.

Figure 3:
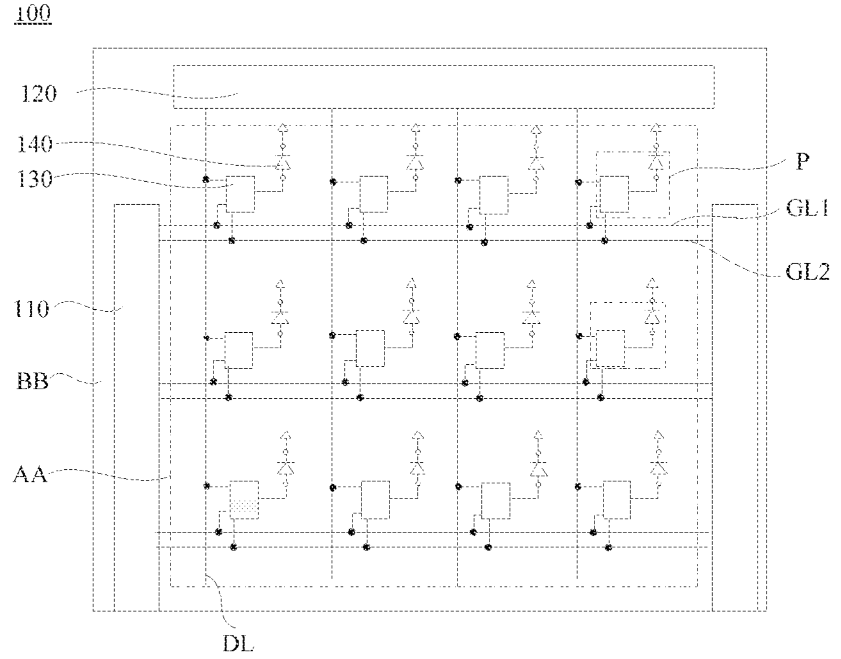
FIG. 3 is a structural diagram of a display substrate, in accordance with some embodiments.

For example, referring to FIG. 3, the display substrate 100 may include a display region AA and a peripheral region BB (also referred to as a non-display region) disposed on at least one side of the display region AA. As shown in FIG. 3, the embodiments of the present disclosure are illustrated by taking an example where the peripheral region BB surrounds the display region AA.

As shown in FIG. 2, the display region AA may include a first display region AA1 and a second display region AA2. The light transmittance of the first display region AA1 is greater than the light transmittance of the second display region AA2. In this way, the functional device 1200 (e.g., the distance sensor, the fingerprint recognition module or the front-facing camera) may be provided on a backlight side (another side opposite to the light exit side) of the first display region AA1, which is beneficial to improving a light collection effect of the functional device 1200.

For example, as shown in FIG. 3, the peripheral region BB may at least include gate drive circuits 110 and a data drive circuit 120. The display region AA may at least include a plurality of sub-pixels P, a plurality of data lines DL, a plurality of first gate lines GL1 and a plurality of second gate lines GL2.

The sub-pixel P is a minimum light-emitting unit of the display substrate 100. For example, the plurality of sub-pixels P may include a plurality of first color sub-pixels P1, a plurality of second color sub-pixels P2 and a plurality of third color sub-pixels P3 (not shown in the figure). When the display substrate works, the first color sub-pixel P1 is used to emit light of the first color, the second color sub-pixel P2 is used to emit light of the second color, and the third color sub-pixel P3 is used to emit light of the third color.

The first color, the second color and the third color may be the three primary colors of light (green, blue and red), respectively. In this way, after the light of the first color, the light of the second color and the light of the third color are mixed, rich colors may be produced. For example, the first color may be green, the second color may be blue, and the third color may be red.

As shown in FIG. 3, each sub-pixel P includes a pixel circuit 130 and a light-emitting device 140.

A plurality of pixel circuits 130 of the plurality of sub-pixels P are electrically connected to the data drive circuit 120 located in the peripheral region BB by a plurality of data lines DL. For example, multiple pixel circuits 130 of each column of sub-pixels P are electrically connected to the data drive circuit 120 by a data line DL.

The plurality of pixel circuits 130 of the plurality of sub-pixels P are electrically connected to the gate drive circuits 110 by a plurality of first gate lines GL1 and a plurality of second gate lines GL2. For example, multiple pixel circuits 130 of each row of sub-pixels P are electrically connected to the gate drive circuits 110 by a first gate line GL1 and a second gate line GL2.

In some embodiments, the pixel circuit 130 may include a plurality of switching devices and at least one capacitor Cst. For example, the switching device may be a thin film transistor (TFT) or a field effect transistor (e.g., metal oxide semiconductor transistor, MOS transistor). The embodiments of the present disclosure are described by considering an example where the switching devices are TFTs. That is, the pixel circuit 130 includes a plurality of TFTs. The TFT may be a P-type transistor or an N-type transistor. The P-type transistor is turned on due to the action of a low potential and turned off due to the action of a high potential; and the N-type transistor is turned on due to the action of a high potential and turned off due to the action of a low potential.

Figure 4:
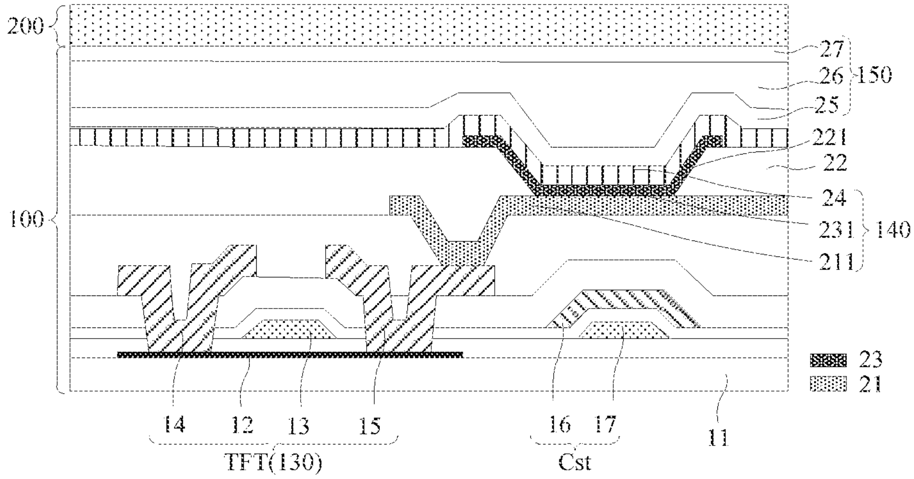
FIG. 4 is a sectional view showing a structure of a display substrate, in accordance with some embodiments.

For examples, as shown in FIG. 4, the display substrate 100 may include a substrate 11. The TFT may include a semiconductor pattern 12, a gate 13, a source 14 and a drain 15 that are provided on the substrate 11. The source 14 and the drain 15 are located in the same layer, that is, the source 14 and the drain 15 may be formed simultaneously through the same film formation process. Moreover, the source 14 and the drain 15 may be symmetrical in structure, that is, there may be no difference in structure between the source 14 and the drain 15. The capacitor may include a first electrode plate 16 and a second electrode plate 17. It can be understood that in a direction perpendicular to the substrate 11, there is at least one insulating layer included between every two adjacent conductive layers (which will not be repeated in the embodiments of the present disclosure).

The display substrate 100 further includes an anode layer 21, a pixel defining layer 22, a light-emitting functional layer 23 and a cathode layer 24 that are disposed on a side of the pixel circuits 130 away from the substrate 11. The anode layer 21 includes a plurality of anodes 211 separated from each other (only one anode 211 is exemplarily shown in FIG. 4). The pixel defining layer 22 is provided with a plurality of pixel openings 221, and each pixel opening 221 exposes at least part of an anode 211 and defines a light-emitting region of a sub-pixel P. The light-emitting functional layer 23 includes a plurality of light-emitting functional patterns 231 (only one light-emitting functional pattern 231 is exemplarily shown in FIG. 4), and at least part of each light-emitting functional pattern 231 is located within a pixel opening 221. The cathode layer 24 has a whole-layer structure. Each anode 211, a light-emitting functional pattern 231 located on the anode 211 and a portion of the cathode layer 24 facing the anode 211 constitute a light-emitting device 140 together.

In some embodiments, the light-emitting functional layer 23 may include a light-emitting layer. In some other embodiments, in addition to the light-emitting layer, the light-emitting functional layer 23 further includes one or more of an electron transporting layer (ETL), an electron injection layer (EIL), a hole transporting layer (HTL) and a hole injection layer (HIL).

Referring to FIG. 4, the display substrate 100 further includes an encapsulation layer 150 disposed on a side of the cathode layer 24 away from the substrate 11. The encapsulation layer 150 may include, for example, a first inorganic material layer 25, an organic material layer 26 and a second inorganic material layer 27 that are stacked in sequence in a direction perpendicular to the substrate 11 and away from the substrate 11 (i.e., a direction from the bottom to the top in FIG. 4).

The first inorganic material layer 25 and the second inorganic material layer 27 can isolate moisture and oxygen, reduce the risk of each film structure below the encapsulation layer 150 being eroded by external moisture and oxygen, especially reduce the risk of the light-emitting functional layer 23 being eroded by the moisture and oxygen, and improve the service life of the display substrate 100. The organic material layer 26 may be used to planarize the light exit surface of the display substrate 100 and release stress of the display substrate 100.

As shown in FIG. 4, the touch layer 200 is disposed on the light exit side of the display substrate 100, that is, on a side of the encapsulation layer 150 away from the substrate 11. For example, the touch layer 200 may be disposed on a surface of the second inorganic material layer 27 of the encapsulation layer 150 away from the substrate 11.

Figure 5:
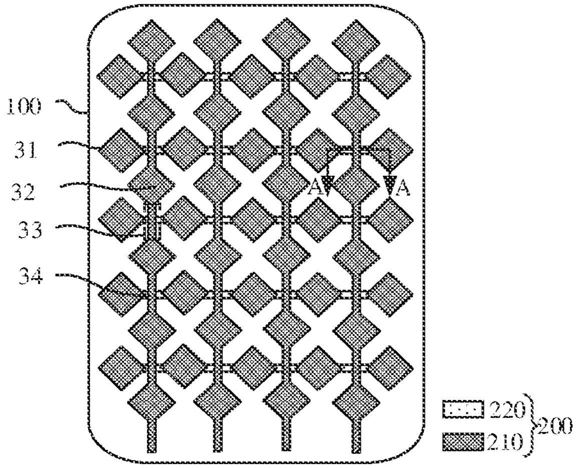
FIG. 5 is a structural diagram of a touch layer, in accordance with some embodiments.
Figure 6:
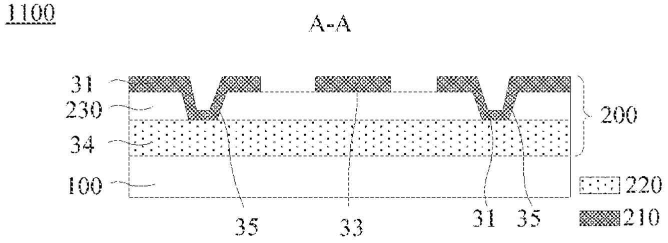
FIG. 6 is a sectional view taken along a section line A-A in FIG. 5.

Referring to FIGS. 5 and 6, the touch layer 200 may include a first metal layer 210, a second metal layer 220, and an insulating layer 230 located between the first metal layer 210 and the second metal layer 220. For example, the first metal layer 210 is provided further away from the display substrate 100 than the second metal layer 220.

In some embodiments, the touch layer 200 may further include a buffer layer and a protective layer. For example, the buffer layer is disposed between the encapsulation layer 150 and both the first metal layer 210 and the second metal layer 220, and may play a role of protecting the second inorganic material layer 27. The protective layer is disposed on a side of both the first metal layer 210 and the second metal layer 220 away from the substrate 11, and may play a role of protecting the first metal layer 210 and the second metal layer 220. For example, in a case where the first metal layer 210 is provided further away from the display substrate 100 than the second metal layer 220, the buffer layer may be disposed between the second inorganic material layer 27 and the second metal layer 220, and the protective layer may be disposed on a side of the first metal layer 210 away from the substrate 11.

One of the first metal layer 210 and the second metal layer 220 includes a plurality of first touch electrodes 31, a plurality of second touch electrodes 32 and a plurality of connection portions 33, and the other of the first metal layer 210 and the second metal layer 220 includes a plurality of bridge portions 34. The first insulating layer 230 is provided with a plurality of via holes 35 therein.

For example, referring to FIG. 5, the first metal layer 210 includes the plurality of first touch electrodes 31, the plurality of second touch electrodes 32 and the plurality of connection portions 33, and the second metal layer 220 includes the plurality of bridge portions 34.

Each connection portion 33 connects two adjacent first touch electrodes 31, and each bridge portion 34 connects two adjacent second touch electrodes 32 through via holes 35 (as shown in FIGS. 5 and 6).

Alternatively, each connection portion connects two adjacent second touch electrodes, and each bridge portion connects two adjacent first touch electrodes through via holes (not shown in the figure).

Figure 7:
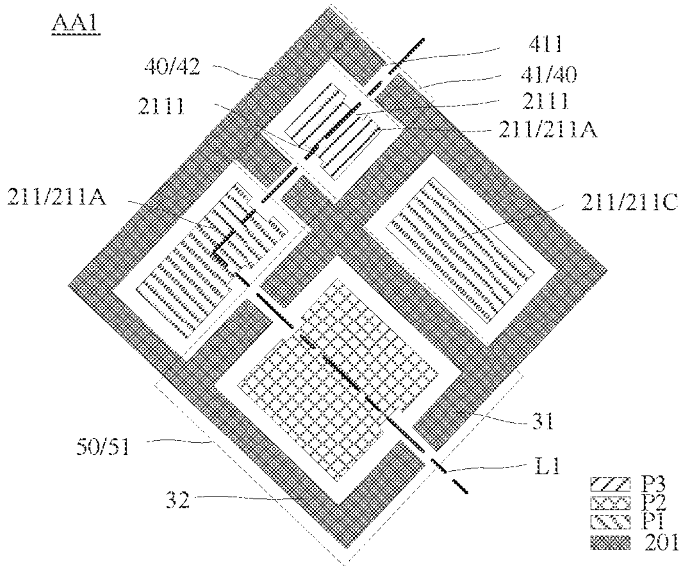
FIG. 7 is a structural diagram of a first display region, in accordance with some embodiments.

Referring to FIG. 7, the touch layer 200 includes a metal mesh structure 201.

At least one of the first touch electrodes 31, the second touch electrodes 32, the connection portions 33 and the bridge portions 34 includes the metal mesh structure 201. For example, the first touch electrodes 31, the second touch electrodes 32, the connection portions 33 and the bridge portions 34 all include the metal mesh structure 201.

The metal mesh structure 201 includes a plurality of metal lines 40, and the metal mesh structure 201 includes a plurality of grids 50 surrounded by the plurality of metal lines 40. In the embodiments of the present disclosure, a metal line 40 refers to the smallest continuous line segment that surrounds a grid 50 and extends in direction of a straight line. That is, the grid 50 refers to a pattern surrounded by multiple metal lines 40 connected end to end.

As shown in FIG. 7, the plurality of metal lines 40 include a plurality of first metal lines 41. The first metal line 41 is provided with at least one opening 411. The opening 411 disconnects the first metal line 41. That is, the first metal line 41 includes two metal sub-lines with a gap, and an opening 411 located between the two metal sub-lines.

A plurality of openings 411 in the plurality of first metal lines 41 divide the metal mesh structure 201 into the plurality of first touch electrodes 31 and the plurality of second touch electrodes 32 that are insulated from each other. For example, as shown in FIG. 7, multiple openings 411 in multiple first metal lines 41 are connected in sequence to form a first dividing line L1, and the first dividing line L1 divides the metal mesh structure 201 to form a first touch electrode 31 and a second touch electrode 32.

It can be understood that the shape of the grid 50 may include at least one of a triangle, a rectangle, a pentagon, a hexagon or other irregular shapes. Of course, the shape of the grid 50 may alternatively be in another shape composed of at least one straight line and at least one curve line. The embodiments of the present disclosure do not specifically limit the shape of the grid 50. Therefore, it will be understood that the metal mesh structure 201 shown in FIG. 7 is only a specific structural diagram, but not the only feasible structural diagram. FIG. 7 may be understood as an exemplary explanation of the present disclosure, but should not be understood as a limitation on the present disclosure.

Similarly, the shape of the anode 211 may be a circle, an ellipse, a rectangle, a rhombus, or any other shape. The anode 211 may alternatively be in any other shape composed of at least one straight edge and at least one curved edge. There is no specific limit on this in the embodiments of the present disclosure. The anode 211 shown in FIG. 7 is only a specific structural diagram of the anode, but not the only feasible structural diagram.

Figure 8A:
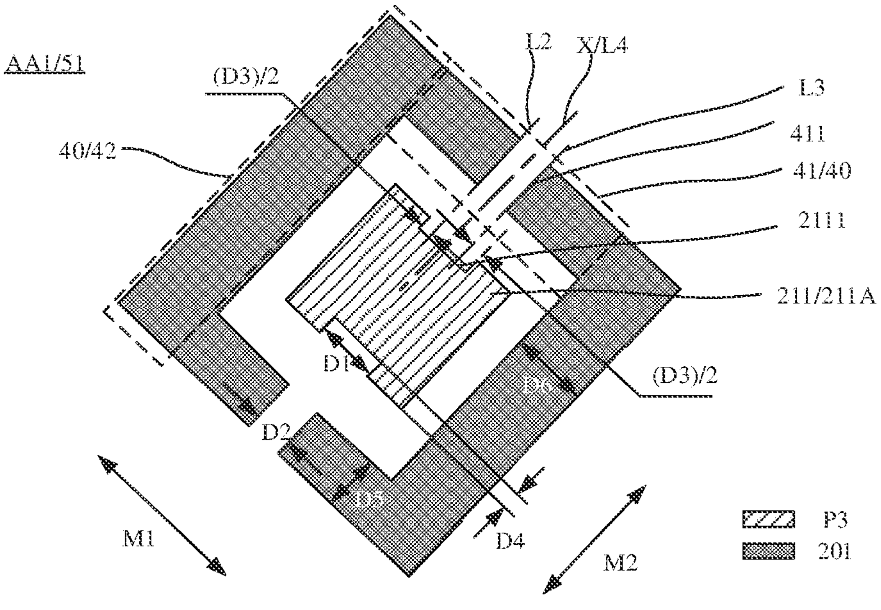
FIG. 8A is a structural diagram of a first grid, in accordance with some embodiments.
Figure 8B:
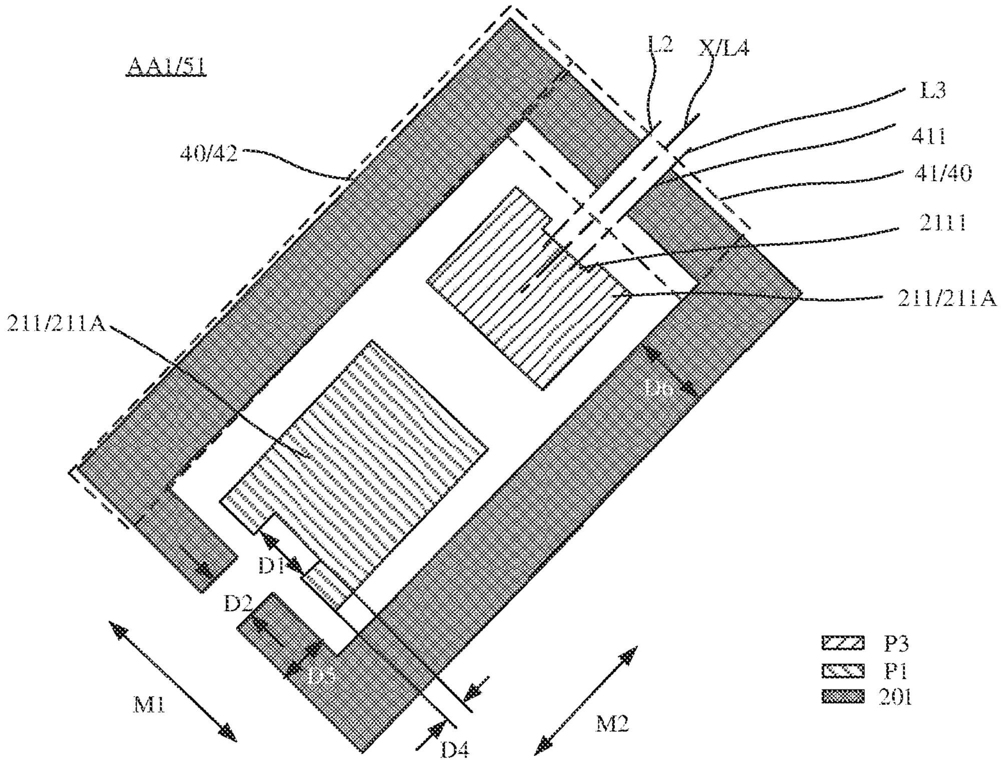
FIG. 8B is a structural diagram of another first grid, in accordance with some embodiments.

As shown in FIG. 8A, an orthogonal projection of a grid 50 on the substrate 11 may surround an orthographic projection of the anode 211 on the substrate 11. As shown in FIG. 8B, the orthogonal projection of the grid 50 on the substrate 11 may surround orthographic projections of multiple anodes 211 (two anodes 211 are shown as an example in FIG. 8B) on the substrate 11.

When the display panel 1100 works, part of the light emitted by the light-emitting functional patterns 231 exits through the display panel 1100 in a direction substantially perpendicular to the substrate 11 and away from the substrate 11, and part of the light is incident on the anode 211 in a direction substantially perpendicular to the substrate 11 and towards the substrate 11, and then exits through the display panel 1100 in the direction substantially perpendicular to the substrate 11 and away from the substrate 11 after being reflected by the anode 211. Part of the exiting light is directed to metal lines 40 of the metal mesh structure 201, and cannot exit through the light exit surface of the display panel 1100 after being blocked by the metal lines 40.

In the related art, the metal line 40 can block the light exiting from the display substrate 100. However, in the grid 50 formed by the first metal lines 41, the opening 411 of the first metal line 41 cannot block the light exiting from the display substrate 100. Therefore, compared with the amount of light exiting from other positions where the metal line 40 (including the two metal sub-lines of the first metal line 41) is provided, more light exits at the opening 411. As a result, there is a difference between amounts of light exiting from different positions of the display panel 1100, resulting in poor uniformity of light exiting from the display panel 1100, thereby affecting the display effect of the display apparatus 1000.

In order to solve the above technical problem, referring to FIG. 7, in the display apparatus 1000 provided by embodiments of the present disclosure, edge(s) of at least one anode 211 in the plurality of anodes 211 are provided with at least one groove 2111 therein. An orthographic projection of each of the plurality of first metal lines 41 on the substrate 11 is located between orthographic projections of the plurality of anodes 211 on the substrate 11. An orthogonal projection of each groove 2111 of at least one anode 211 (all anodes 211 provided with the groove(s) 2111 therein) on the substrate 11 is provided opposite to an orthogonal projection of an opening 411 of the first metal line 41 on the substrate 11. That is, the groove 2111 is provided at a position of the at least one anode 211 opposite to the opening 411 of the first metal line 41. In this way, the anode 211 cannot reflect the light emitted by the light-emitting functional layer 23 towards the anode 211 at the groove 2111, and thus the amount of light exiting through the opening 411 opposite to the groove 2111 may be reduced, thereby improving the uniformity of light exiting from different positions (the opening 411 and the metal line 40) of the display panel 1100, and improving the display effect of the display panel 1100.

In some embodiments, referring to FIG. 8A, a length D1 of the groove 2111 in a first direction M1 is greater than or equal to a length D2 of the opening 411 provided opposite to the groove 2111 in the first direction M1. The first direction M1 is substantially parallel to an extending direction of the first metal line 41 where the opening 411 is located. In this way, the light exiting through the opening 411 after being reflected by the anode 211 may be reduced to a greatest extend, thereby improving the display uniformity of the display panel 1100.

For example, in a case where the length D1 of the groove 2111 in the first direction M1 is substantially equal to the length D2 of the opening 411 in the first direction M1, two ends of the groove 2111 in the first direction M1 are respectively substantially flush with two ends of the opening 411 in the first direction M1.

For example, as shown in FIG. 8A, in a case where the length D1 of the groove 2111 in the first direction M1 is greater than the length D2 of the opening 411 in the first direction M1, a first reference line L2 and a second reference line L3, in a second direction M2, respectively through the two ends of the opening 411 in the first direction M1 are both located between the two ends of the groove 2111 in the first direction M1. The second direction M2 is parallel to the substrate 11 and perpendicular to the first direction M1.

In some embodiments, in a case where the length D1 of the groove 2111 in the first direction M1 is greater than the length of the opening 411 in the first direction M1, the length of the groove in the first direction M1 is D1, the length of the opening 411 provided opposite to the groove 2111 is D2, and D1 is equal to a sum of D2 and a value ranging from 0.1 μm to 1 μm, inclusive (i.e., D1=D2+ (0.1 μm to 1 μm)). That is, the length of the groove 2111 is 0.1 μm to 1 μm greater than the length of the opening 411. For example, D1 is equal to a sum of D2 and 0.1 μm (i.e., D1=D2+0.1 μm); alternatively, D1 is equal to a sum of D2 and 0.4 μm (i.e., D1=D2+0.4 μm); alternatively, D1 is equal to a sum of D2 and 0.7 μm (i.e., D1=D2+0.7 μm); alternatively, D1 is equal to a sum of D2 and 1 μm (i.e., D1=D2+1 μm). The embodiments of the present disclosure will not list this one by one.

It can be understood that if the length of the groove 2111 in the first direction M1 is too short, part of the light reflected by portions of the anode 211 located on both sides of the groove 2111 may exit from the opening 411, which is not conducive to improving the uniformity of the light exiting from the display panel 1100. Therefore, D1 is greater than or equal to the sum of D2 and 0.1 μm (i.e., D1>D2+0.1 μm). If the length of the groove 2111 in the first direction M1 is too long, the amount of the light reflected by the anode 211 may be caused to be reduced, and thus the light extraction efficiency of the display panel 1100 may be reduced. Based on this, D1 is less than or equal to the sum of D2 and 1 μm (i.e., D1≤D2+1 μm).

For example, the length D2 of the opening 411 in the first direction M1 may be in a range of 3 μm to 5 μm, inclusive. Based on this, the length D1 of the groove 2111 in the first direction M1 may be in a range of 3.1 μm to 6 μm, inclusive. For example, the length D2 of the opening 411 is 3 μm, and the length D1 of the groove 2111 may be 3.1 μm, 3.5 μm, or 4 μm; alternatively, the length D2 of the opening 411 is 3.5 μm, and the length D1 of the groove 2111 may be 3.6 μm, 3.9 μm, or 4.5 μm; alternatively, the length D2 of the opening 411 is 5 μm, and the length D1 of the groove 2111 may be 5.1 μm, 5.3 μm or 6 μm. The embodiments of the present disclosure are not listed one by one here.

In some embodiments, the groove 2111 is arranged symmetrically about a reference plane X. This is beneficial to improving the uniformity of light exiting from both sides of opening 411 in the first direction M1. The reference plane X is perpendicular to the substrate 11 and passes through a center line L4 of the opening 411 extending in the second direction M2. The second direction M2 is parallel to the substrate 11 and perpendicular to the first direction M1.

In some embodiments, in the first direction M1, a difference between the length D1 of the groove 2111 and the length D2 of the opening 411 provided opposite to the groove 2111 is D3, that is, D3 is equal to a difference between D1 and D2 (i.e., D3=D1-D2). In the second direction M2, a depth of the groove 2111 is D4. D4 is equal to a value ranging from 0.3 times D3 to 0.7 times D3 (i.e., D4=(0.3 to 0.7)×D3). That is, the depth of the groove 2111 is 0.3 to 0.7 times the difference between the length of the groove 2111 and the length of the opening 411. In this way, the groove 2111 may not only reduce the light exiting through the opening 411 after being reflected by the anode 211, but also reduce a deformation degree of the light-emitting region of the sub-pixel P caused by the groove 2111 and reduce an influence of the groove 2111 on an overall shape of the anode 211. This is beneficial to improving the light extraction efficiency of the display panel 1100. As shown in FIG. 8A, in the first direction M1, a distance between an end of the groove 2111 and the other end of the opening 411 is (D3)/2.

For example, D3 may be in a range of 0.1 μm to 1 μm, inclusive. Moreover, taking into account the ability of the groove 2111 reducing the reflection of the anode 211, the depth D4 of the groove 2111 may be in a range of 0.1 μm to 0.7 μm, inclusive. For example, the depth D4 of the groove may be 0.1 μm, 0.2 μm, 0.5 μm or 0.7 μm. In different products, the depth of the groove 2111 may be specifically set according to the actual optical effect.

Figure 9:
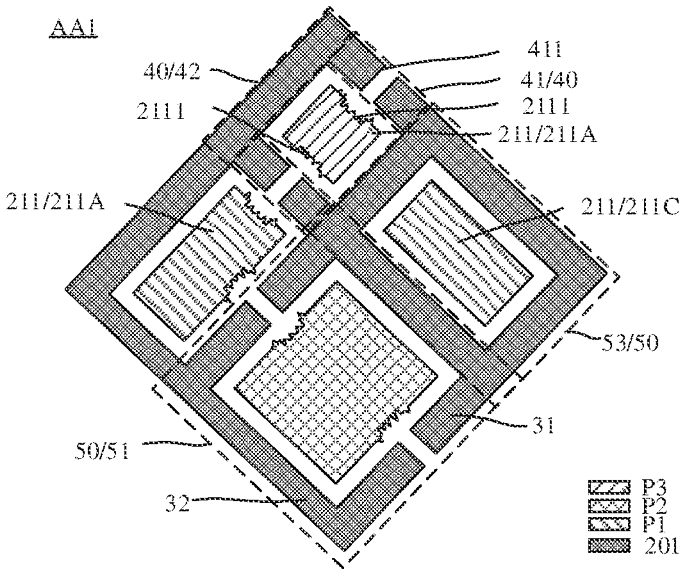
FIG. 9 is a structural diagram of another first display region, in accordance with some embodiments.

In some embodiments, referring to FIG. 9, a side edge of the groove 2111 opposite to the first metal line 41 is in a zigzag shape. In this way, the light reflected by the edge of the anode 211 may be scattered to a certain extent, so as to improve the uniformity of the light reflected by the anode 211, thereby improving the uniformity of the light exiting from the display panel 1100.

For example, referring to FIG. 9, in order to further improve the uniformity of the light exiting from the display panel 1100, at least part of the side edges of the anode 211 adjacent to the groove 2111 may be in the zigzag shapes.

Figure 10:
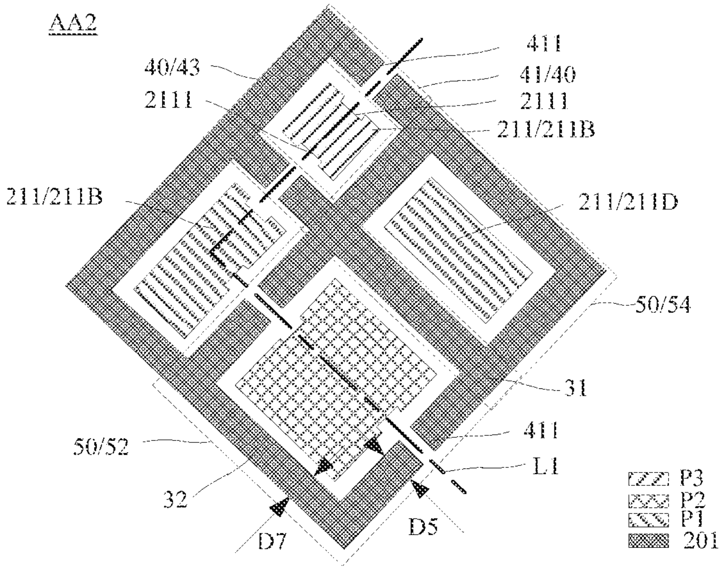
FIG. 10 is a structural diagram of a second display region, in accordance with some embodiments.
Figure 11:
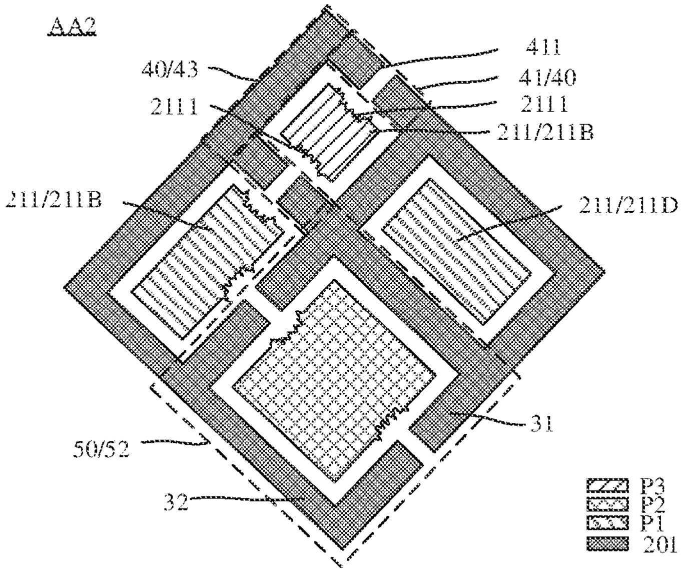
FIG. 11 is a structural diagram of another second display region, in accordance with some embodiments.

In some embodiments, in a case where the display substrate 100 includes the first display region AA1 and the second display region AA2, and the light transmittance of the first display region AA1 is greater than the light transmittance of the second display region AA2, the plurality of anodes 211 may include both a plurality of first anodes 211A and a plurality of third anodes 211C that are located in the first display region AA1 (as shown in FIGS. 7 and 9), and both a plurality of second anodes 211B and a plurality of fourth anodes 211D that are located in the second display region AA2 (as shown in FIGS. 10 and 11).

The metal mesh structure 201 includes a plurality of first grids 51, and each first grid 51 includes at least two first metal lines 41, that is, the first grid 51 includes at least two openings 411. In this way, the at least two openings 411 may divide the first grid 51 into at least two portions that are insulated from each other, so that the first grid 51 is at least located in a first touch electrode 31 and a second touch electrode 32.

An orthogonal projection of the first grid 51 on the substrate 11 surrounds an orthographic projection of at least one first anode 211A on the substrate 11. An edge of each first anode 211A includes at least one groove 2111. That is, some anodes 211 located in the first display region AA1 and surrounded by the first grids 51 are the first anodes 211A, and at least one groove 2111 is provided in the first anode 211A.

An orthogonal projection of each groove 2111 of the first anode 211A on the substrate 11 is provided opposite to an opening 411 of the first grid 51 (the first metal line 41). This is beneficial to improving the display uniformity of the first display region AA1.

In some embodiments, referring to FIG. 8A, the orthogonal projection of the first grid 51 on the substrate surrounds an orthographic projection of a single first anode 211A on the substrate 11, two grooves 2111 are provided in edges of the first anode 211A, and each groove 2111 is provided opposite to an opening 411 of the first grid 51.

In some other embodiments, referring to FIG. 8B, the orthogonal projection of the first grid 51 on the substrate 11 may surround orthographic projections of multiple (e.g., two) first anodes 211A on the substrate 11, two openings 411 of the first grid 51 are respectively provided opposite to different first anodes 211A, and each first anode 211A may include a groove 2111.

Referring to FIG. 8A, the metal mesh structure 201 (the plurality of metal lines 40) further includes a plurality of second metal lines 42. The plurality of second metal lines 42 are located in the first display region AA1, and the plurality of second metal lines 42 are continuous line segments. The first grid 51 further includes at least one second metal line 42. That is, the first grid 51 includes at least two first metal lines 41 and at least one second metal line 42. For example, as shown in FIG. 8A, the first grid 51 includes two first metal lines 41 and two second metal lines 42.

A line width D5 of the first metal line 41 is smaller than a line width D6 of the second metal line 42. That is, in the first display region AA1, the line width of the metal line 40 with the opening 411 is smaller than the line width of the continuous metal line 40 (the metal line 40 without the opening 411). In this way, resistance of a portion of the metal mesh structure 201 located in the first display region AA1 may be reduced through the second metal line 42, and a distance between the first metal line 41 and the anode 211 may be reduced through the first metal line 41, so that the enclosed first grid 51 may have a large space. This is beneficial to enlarging an area of the anode 211, thereby compensating for a decrease in area of the first anode 211A caused by the groove 2111, and ensuring an effective light-emitting area and a light extraction rate of the sub-pixel P where the first anode is located.

In some embodiments, referring to FIG. 10, the metal mesh structure 201 (the plurality of metal lines 40) further includes a plurality of third metal lines 43. The plurality of third metal lines 43 are located in the second display region AA2, and the plurality of third metal lines 43 are continuous line segments. The line width D5 of the first metal line 41 is substantially equal to a line width D7 of the third metal line 43. This is beneficial to reducing manufacturing difficulty of the first metal line 41 and the third metal line 43 and reducing manufacturing difficulty of the metal mesh structure 201.

In some embodiments, as shown in FIG. 10, the metal mesh structure 201 further includes a plurality of second grids 52, and each second grid 52 includes at least two first metal lines 41, that is, the second grid 52 includes at least two openings 411. In this way, the at least two openings 411 may divide the second grid 52 into at least two portions that are insulated from each other, so that the second grid 52 is at least located in a first touch electrode 31 and a second on the touch electrode 32.

It can be understood that metal lines 40 that are close to each other in two adjacent grids 50 are shared, that is, each metal line 40 located between two anodes 211 may be used to surround to form at least two grids 50.

The plurality of anodes 211 further includes a plurality of second anodes 211B. The plurality of second anodes 211B are located in the second display region AA2, and an orthogonal projection of each second grid 52 on the substrate 11 surrounds an orthographic projection of at least one second anode 211B on the substrate 11. An orthogonal projection of the opening 411 of the second grid 52 (the first metal line 41) on the substrate 11 is provided opposite to the groove 2111 of the second anode 211B.

In some embodiments, similar to the first grid 51, the orthogonal projection of the second grid 52 on the substrate 11 surrounds an orthographic projection of a single second anode 211B on the substrate 11, and two grooves 2111 are provided in edges of the second anode 211B.

In some other embodiments, similar to the first grid 51, the orthogonal projection of the second grid 52 on the substrate 11 may surround orthographic projections of multiple (e.g., two) second anodes 211B on the substrate 11, two openings 411 of the second grid 52 are respectively provided opposite to different second anodes 211B, and thus each second anode 211B may include a groove 2111.

In some embodiments, as shown in FIG. 11, a side edge of the groove 2111 in the second anode 211B proximate to the first metal line 41 may also be in a zigzag shape.

In a case where the plurality of metal lines 40 include the plurality of third metal lines 43, the second grid 52 includes at least two first metal lines 41 and multiple third metal lines 43. For example, as shown in FIG. 10, in a case where the second grid 52 is substantially in a rectangular shape, the second grid 52 may include two first metal lines 41 and two third metal lines 43.

The line width of the first metal line 41 is substantially equal to the line width of the third metal line 43. That is, the line widths of the second grid 52 are equal everywhere. This is beneficial to improving the uniformity of the metal lines 40 in the second display region AA, so that the metal lines 40 have substantially the same blocking effect on the light exiting from the sub-pixel P, thereby improving the display uniformity of the second display region AA2.

It can be understood that for the first anode 211A and the second anode 211B each for forming sub-pixels of the same color, the structures of the two may be the same. However, the first anode 211A is located in the first display region AA1, and the second anode 211B is located in the second display region AA2. For example, the first anode 211A for forming the first color sub-pixel P1 and located in the first display region AA1 may have the same structure as the second anode 211B for forming the first color sub-pixel P1 and located in the second display region AA2.

Referring to FIGS. 9 and 10, the plurality of third anodes 211C are located in the first display region AA1, that is, the first display region AA1 includes the plurality of first anodes 211A and the plurality of third anodes 211C. The plurality of fourth anodes 211D are located in the second display region AA2, that is, the second display region AA2 includes the plurality of second anodes 211B and the plurality of fourth anodes 211D.

The metal mesh structure 201 further includes a plurality of third grids 53 and a plurality of fourth grids 54. Orthogonal projections of the plurality of third grids 53 and the plurality of fourth grids 54 on the substrate 11 are continuous closed patterns. That is, there are no openings 411 in the third grid 53 and the fourth grid 54. Therefore, the third grid 53 and the fourth grid 54 have substantially the same blocking effect on the light exiting from the sub-pixels P.

An orthogonal projection of each third grid 53 on the substrate 11 surrounds an orthographic projection of a third anode 211C on the substrate 11. That is, the third grid 53 is located in the first display region AA1. In a case where the metal mesh structure 201 (the plurality of metal lines 40) includes a plurality of second metal lines 42 located in the first display region AA1, the third grid 53 may include multiple second metal lines 42 connected end to end.

An orthogonal projection of each fourth grid 54 on the substrate 11 surrounds an orthographic projection of a fourth anode 211D on the substrate 11. That is, the fourth grid 54 is located in the second display region AA2. In a case where the metal mesh structure 201 (the plurality of metal lines 40) includes a plurality of third metal lines 43 located in the second display region AA2, the fourth grid 54 may include multiple third metal lines 43 connected end to end.

Figure 12:
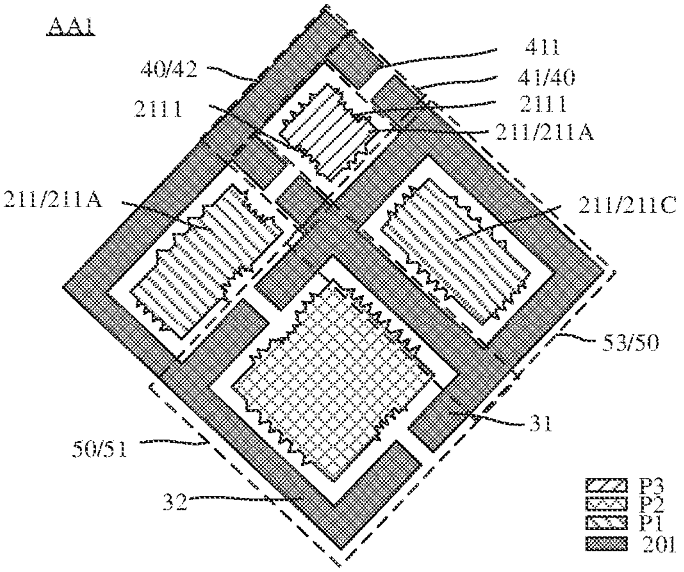
FIG. 12 is a structural diagram of yet another first display region, in accordance with some embodiments.
Figure 13:
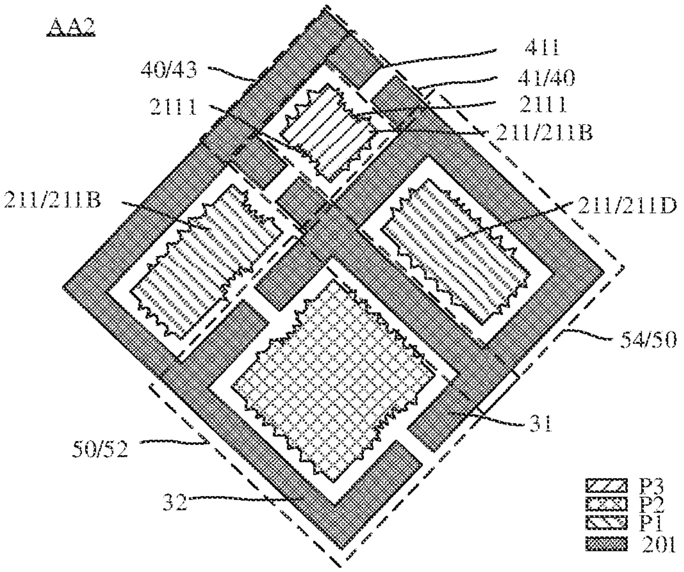
FIG. 13 is a structural diagram of yet another second display region, in accordance with some embodiments.

In some embodiments, as shown in FIGS. 12 and 13, at least part of edges of the third anode 211C are in zigzag shapes, and/or at least part of edges of the fourth anode 211D are in zigzag shapes. This is beneficial to weakening a display difference between the first display region AA1 and the second display region AA2, and improving the display uniformity of the display panel 1100.

For example, as shown in FIG. 12, all edges of the first anode 211A and the third anode 211C may be in zigzag shapes. As shown in FIG. 13, all edges of the second anode 211B and the fourth anode 211D may be in zigzag shapes. In this way, the light reflected by the edges of each anode 211 may be scattered, thereby improving the uniformity of the light reflected by the anode 211 and improving the uniformity of the light exiting from the display panel 1100.

In some embodiments, areas of the first anode 211A, the second anode 211B, the third anode 211C and the fourth anode 211D included in a plurality of first color sub-pixels P1 are substantially equal. That is, the areas of the anodes 211 of all the first color sub-pixels P1 are substantially equal. In this way, the luminous uniformity of the first color sub-pixels P1 in different regions and/or with different structures of anodes 211 may be improved. That is, each first color sub-pixel P1 has substantially the same effective display area and exits substantially the same light.

Areas of the first anode 211A, the second anode 211B, the third anode 211C and the fourth anode 211D included in a plurality of second color sub-pixels P2 are substantially equal. That is, the areas of the anodes 211 of all the second color sub-pixels P2 are substantially equal. In this way, the luminous uniformity of the second color sub-pixels P2 in different regions and/or with different structures of anodes 211 may be improved. That is, each second color sub-pixel P2 has substantially the same effective display area and exits substantially the same light.

Areas of the first anode 211A, the second anode 211B, the third anode 211C and the fourth anode 211D included in a plurality of third color sub-pixels P3 are substantially equal. That is, the areas of the anodes 211 of all the third color sub-pixels P3 are substantially equal. In this way, the luminous uniformity of the third color sub-pixels P3 in different regions and/or with different structures of anodes 211 may be improved. That is, each third color sub-pixel P3 has substantially the same effective display area and exits substantially the same light.

It can be understood that the above embodiments of the present disclosure may be flexibly combined according to actual needs. For example, only at least part of the first anodes 211A may be provided with the grooves 2111; alternatively, only edges of at least part of the second anodes 211B may be provided with the grooves 2111. The structures of the grooves 2111 in different anodes 211 may be the same or different. For example, an edge of one of the groove 2111 of the first anode 211A and the groove 2111 of the second anode 211B is in a zigzag shape, and an edge of the other is substantially in a straight shape. In the embodiments of the present disclosure, combinations of the above various embodiments are not listed one by one.

The foregoing descriptions are merely specific implementation manners of the present disclosure, but the protection scope of the present disclosure is not limited thereto. Changes or replacements that any person skilled in the art could conceive of within the technical scope of the present disclosure shall all be included in the protection scope of the present disclosure. Therefore, the protection scope of the present disclosure shall be subject to the protection scope of the claims.

What is claimed is:

1. A display panel, comprising:

a display substrate including a substrate and an anode layer disposed on a side of the substrate; the anode layer including a plurality of anodes, and at least one edge of at least one anode being provided with at least one groove therein; and a touch layer located on a light exit side of the display substrate; the touch layer including a metal mesh structure, the metal mesh structure including a plurality of first metal lines, and each first metal line including an opening; an orthographic projection of each of the plurality of first metal lines on the substrate being located between orthographic projections of the plurality of anodes on the substrate; wherein an orthogonal projection of each groove of the at least one anode on the substrate is disposed opposite to an orthogonal projection of the opening of the first metal line on the substrate.

2. The display panel according to claim 1, wherein a length of each groove in a first direction is greater than or equal to a length of an opening opposite to the groove in the first direction; and the first direction is substantially parallel to an extending direction of the first metal line where the opening is located.

3. The display panel according to claim 2, wherein in the first direction, the length of the groove is D1, the length of the opening opposite to the groove is D2, and D1 is equal to a sum of D2 and a value ranging from 0.1 μm to 1 μm, inclusive (D1=D2+(0.1 μm to 1 μm)).

4. The display panel according to claim 2, wherein in the first direction, a difference between the length of the groove and the length of the opening opposite to the groove is D3; in a second direction, a depth of the groove is D4; and D4 is equal to a value ranging from 0.3 times D3 to 0.7 times D3 (D4=(0.3 to 0.7)×D3); the second direction is parallel to the substrate and perpendicular to the first direction.

5. The display panel according to claim 2, wherein the groove is arranged symmetrically about a reference plane; the reference plane is perpendicular to the substrate and passes through a center line of the opening extending in a second direction, and the second direction is parallel to the substrate and perpendicular to the first direction.

6. The display panel according to claim 1, wherein a side edge of each groove opposite to the first metal line is in a zigzag shape.

7. The display panel according to claim 6, wherein at least part of a side edge of the anode adjacent to the groove is in a zigzag shape.

8. The display panel according to claim 1, wherein the display panel has a first display region and a second display region, and light transmittance of the first display region is greater than light transmittance of the second display region;

the plurality of anodes include a plurality of first anodes, the plurality of first anodes are located in the first display region, and at least one edge of each first anode includes at least one groove; and the metal mesh structure includes a plurality of first grids, each first grid includes at least two first metal lines, and an orthogonal projection of the first grid on the substrate surrounds an orthographic projection of at least one first anode on the substrate.

9. The display panel according to claim 8, wherein the orthogonal projection of the first grid on the substrate surrounds an orthographic projection of a single first anode on the substrate, and edges of the single first anode are provided with two grooves therein.

10. The display panel according to claim 8, wherein the metal mesh structure further includes a plurality of second metal lines, the plurality of second metal lines are located in the first display region, and the plurality of second metal lines are continuous line segments;

the first grid further includes at least one second metal line; and a line width of the first metal line is smaller than a line width of the second metal line.

11. The display panel according to claim 10, wherein the metal mesh structure further includes a plurality of third metal lines, the plurality of third metal lines are located in the second display region, and the plurality of third metal lines are continuous line segments; and the line width of the first metal line is substantially equal to a line width of a third metal line.

12. The display panel according to claim 8, wherein the plurality of anodes further includes a plurality of second anodes, the plurality of second anodes are located in the second display region, and at least one edge of each second anode includes at least one groove; and the metal mesh structure further includes a plurality of second grids, each second grid includes at least two first metal lines, and an orthogonal projection of the second grid on the substrate surrounds an orthographic projection of at least one second anode on the substrate.

13. The display panel according to claim 12, wherein the orthogonal projection of the second grid on the substrate surrounds an orthographic projection of a single second anode on the substrate, and edges of the single second anode are provided with two grooves therein.

14. The display panel according to claim 12, wherein the metal mesh structure further includes a plurality of third metal lines located in the second display region, and the second grid further includes at least one third metal located in the second di line.

15. The display panel according to claim 8, wherein the plurality of anodes further includes a plurality of third anodes and a plurality of fourth anodes, the plurality of third anodes are located in the first display region, and the plurality of fourth anodes are located in the second display region;

the metal mesh structure further includes a plurality of third grids and a plurality of fourth grids; orthogonal projections of the plurality of third grids and the plurality of fourth grids on the substrate are continuous closed patterns; an orthogonal projection of each third grid on the substrate surrounds an orthographic projection of a third anode on the substrate, and an orthogonal projection of each fourth grid on the substrate surrounds an orthographic projection of a fourth anode on the substrate; and the metal mesh structure further includes a plurality of second metal lines located in the first display region and a plurality of third metal lines located in the second display region, the third metal grid includes multiple second metal lines connected end to end, and the fourth grid includes multiple third metal lines connected end to end.

16. The display panel according to claim 15, wherein at least part of edges of the third anode are in zigzag shapes, and/or at least part of edges of the fourth anode are in zigzag shapes.

17. The display panel according to claim 1, wherein the display panel comprises a plurality of sub-pixels, each sub-pixel includes an anode in the plurality of anodes, and the plurality of sub-pixels includes a plurality of first color sub-pixels, a plurality of second color sub-pixels and a plurality of third color sub-pixels;

the display panel has a first display region and a second display region; the plurality of anodes include a plurality of first anodes with at least one groove and located in the first display region, a plurality of second anodes with at least one groove and located in the second display region, a plurality of third anodes located in the first display region and a plurality of fourth anodes located in the second display region;

areas of a first anode, a second anode, a third anode and a fourth anode included in the plurality of first color sub-pixels are substantially equal;

areas of a first anode, a second anode, a third anode and a fourth anode included in the plurality of second color sub-pixels are substantially equal; and areas of a first anode, a second anode, a third anode and a fourth anode included in the plurality of third color sub-pixels are substantially equal.

18. The display panel according to claim 1, wherein the touch layer includes a first metal layer, a second metal layer, and an insulating layer located between the first metal layer and the second metal layer; and the insulating layer is provided with a plurality of via holes therein;

one of the first metal layer and the second metal layer includes a plurality of first touch electrodes, a plurality of second touch electrodes and a plurality of connection portions, and another of the first metal layer and the second metal layer includes a plurality of bridge portions; wherein each connection portion connects two adjacent first touch electrodes, and each bridge portion connects two adjacent second touch electrodes through via holes; or each connection portion connects two adjacent second touch electrodes, and each bridge portion connects two adjacent first touch electrodes through via holes; and at least one of the first touch electrodes, the second touch electrodes, the connection portions and the bridge portions includes the metal mesh structure.

19. The display panel according to claim 1, wherein the display substrate further includes:

an encapsulation layer disposed on a side of the anode layer away from the substrate and including a first inorganic material layer, an organic material layer and a second inorganic material layer that are stacked in sequence in a direction perpendicular to the substrate and away from the substrate; wherein the touch layer is disposed on the encapsulation layer.

20. A display apparatus, comprising the display panel according to claim 1.

* * * * *